(12) United States Patent
Endou et al.

(10) Patent No.: US 7,649,370 B2
(45) Date of Patent: Jan. 19, 2010

(54) EVALUATION METHOD OF PROBE MARK OF PROBE NEEDLE OF PROBE CARD USING IMAGINARY ELECTRODE PAD AND DESIGNATED DETERMINATION FRAME

(75) Inventors: Yoshihiko Endou, Kawasaki (JP); Yoshikazu Arisaka, Kawasaki (JP); Tatsuya Miyazaki, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 21 days.

(21) Appl. No.: 11/408,158

(22) Filed: Apr. 21, 2006

(65) Prior Publication Data
US 2007/0170937 A1 Jul. 26, 2007

(30) Foreign Application Priority Data
Jan. 23, 2006 (JP) .............................. 2006-014228

(51) Int. Cl.
*G01R 31/02* (2006.01)
(52) U.S. Cl. ....................................... 324/758
(58) Field of Classification Search ........................ None
See application file for complete search history.

(56) References Cited

U.S. PATENT DOCUMENTS

| 5,172,053 | A | * | 12/1992 | Itoyama | 324/758 |
| 5,644,245 | A | * | 7/1997 | Saitoh et al. | 324/754 |
| 2004/0081349 | A1 | * | 4/2004 | Chaya et al. | 382/145 |
| 2004/0227504 | A1 | * | 11/2004 | Strom | 324/158.1 |

FOREIGN PATENT DOCUMENTS

| EP | 1061381 A2 * | 12/2000 |
| JP | 2-137347 | 5/1990 |
| JP | 5-36765 | 2/1993 |
| JP | 2005-123293 | 5/2005 |

\* cited by examiner

*Primary Examiner*—Paresh Patel
(74) *Attorney, Agent, or Firm*—Westerman, Hattori, Daniels & Adrian, LLP

(57) ABSTRACT

An evaluation method of a probe mark of a probe needle of a probe card, includes the steps of: forming the probe mark of the probe needle on a probe mark evaluation wafer; recognizing the probe mark with imaging; and overlapping an imaginary electrode pad with the probe mark recognized by imaging so that the probe mark is evaluated.

11 Claims, 7 Drawing Sheets

EVALUATION METHOD OF PROBE MARK OF PROBE NEEDLE OF PROBE CARD USING IMAGINARY ELECTRODE PAD AND DESIGNATED DETERMINATION FRAME

BACKGROUND OF THE INVENTION

1. Field of the Invention

The present invention generally relates to evaluation methods of probe marks (contact marks or needle traces) of probe needles of probe cards, and more specifically, to an evaluation method of a probe mark (contact mark or needle trace) of a probe needle of a probe card used for inspecting an electrical property of a semiconductor element provided on a wafer.

2. Description of the Related Art

Conventionally, in a product manufacturing process of a semiconductor device, an integrated circuit (hereinafter "IC") mounted on a wafer has been connected to a tester and a function test for operating a circuit is implemented, so that a bad IC element is found at an early stage and thereby manufacturing cost of the semiconductor device is reduced and productivity of the semiconductor device is improved.

In such a function test, a probe card is used as an IC inspection card in order to wire from the tester to the electrode pad provided on the IC for a while. In the probe card, a probe needle is arranged in advance so as to correspond to an arrangement of the electrode pad of the IC which IC is an object of the inspection.

More specifically, the probe needle of the probe card is made to come in contact with the electrode pad of the IC being the object of the inspection by a driving apparatus called a prober so that a probing test, namely inspection of the electrical property of the IC, is implemented.

In the meantime, as the semiconductor devices have become minute recently, the pitch between the electrode pads and the size of the electrode pads have become narrower. As corresponding to this, a probing technique at high precision has been in demand. Especially, high precision is required for positioning the prober and positioning the probe needle of the probe card.

In addition, Japanese Laid-Open Patent Application Publication No. 2-137347 discloses an inspection method. In this method, a reference data element at the time of positioning a probing needle is prepared through a learning operation. When new species are used as a semiconductor wafer and a probing card corresponding to the wafer, the learning operation is executed using information previously provided by an instruction manual for the first time, stored as positioning information (a reference data element), and information for the second and subsequent positioning of an electrode pad and the probing needle is read from the memory and automated. That is, the reference data element is stored together with a probing-card code, thus automatically conducting subsequent learning.

Furthermore, Japanese Laid-Open Patent Application Publication No. 2005-123293 discloses a method for an inspection probe. In this method, the probe card is set. A probe mark confirming member arranged in a region for confirming a probe mark formed on a needle-point grinding machine and the needle point of a probe needle for the probe card are aligned. The probe needle is brought into contact with the probe mark confirming member, and the probe mark is formed. The location of the probe mark is detected by a first camera, and the displacement of the location of the detection and the target location of the probe mark to be formed on the probe mark confirming member is obtained. The semiconductor wafer to be inspected is placed on a stage, and the chip of the semiconductor wafer and the needle point of the probe needle are aligned. An electrode pad for the chip is brought into contact with the probe needle but the displacement previously obtained is used in the case of the contact, and the location of the contact is corrected.

However, in the above-discussed related art technique, after a test wafer or a product wafer manufactured as a product is first manufactured, the probe needle of the probe card is made to come in contact with the electrode part of such a product wafer and then the probe mark is checked so that whether the probe needle is within the electrode pad is determined.

Therefore, in a case where the probing test is implemented for the product wafer, if the arrangement of the electrode pad is newly designed, high cost is incurred for the inspection. In addition, if a bad situation exists in the product wafer, the probing test cannot be implemented at that time and this causes delay of product delivery to a customer.

On the other hand, in a probing test when there is no product wafer, the positioning precision of the probe needle is checked by using the probe card inspection device, or a wafer of which the entire main surface is made of aluminum is used and the probe mark of the probe needle formed in the wafer is checked by eye. However, these checks are not sufficient for the inspection, and therefore confirmation using the product wafer is eventually required.

SUMMARY OF THE INVENTION

Accordingly, the present invention may provide a novel and useful evaluation method of a probe mark of a probe needle of a probe card solving one or more of the problems discussed above.

Another and more specific object of the present invention may be to provide an evaluation method of a probe mark of a probe needle of a probe card whereby the probe mark of the probe needle of the probe card can be easily evaluated with a high precision at low cost without manufacturing a product wafer.

The above object of the present invention is achieved by an evaluation method of a probe mark of a probe needle of a probe card, including the steps of:

forming the probe mark of the probe needle on a probe mark evaluation wafer;

recognizing the probe mark with imaging; and overlapping an imaginary electrode pad with the probe mark recognized by imaging so that the probe mark is evaluated.

The imaginary electrode pad may be formed based on information regarding a size of an electrode pad of a chip provided on a wafer which chip is a subject of inspection and a pitch of the electrode pads. The probe mark may be evaluated based on a determination criterion that is whether the probe mark is formed in a designated determination frame provided on the imaginary electrode pad.

The imaginary electrode pad may be formed by operating software. A result of overlap of the imaginary electrode pad and the image-recognized probe mark may be displayed. The probe mark evaluation wafer may be mounted on a wafer mounting part for making alignment before the probe mark is formed on the probe mark evaluation wafer. Aluminum may be formed on a main surface of the probe mark evaluation wafer.

According to an embodiment of the present invention, it is possible to provide the evaluation method of the probe mark of the probe needle of the probe card whereby the probe mark of the probe needle of the probe card can be easily evaluated with a high precision at low cost without manufacturing the product wafer.

Other objects, features, and advantages of the present invention will be come more apparent from the following detailed description when read in conjunction with the accompanying drawings.

DETAILED DESCRIPTION OF THE PREFERED EMBODIMENTS

A description is given below, with reference to the FIG. 1 through FIG. 12 of embodiments of the present invention.

First, the structure of a probe device of an embodiment of the present invention is discussed with reference to FIG. 1.

Figure 1:
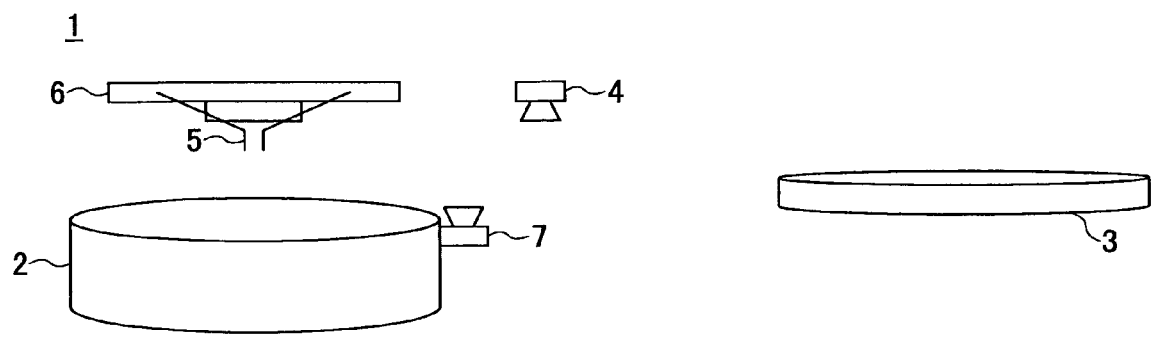
FIG. 1 is a schematic view showing a structure of a probe device of an embodiment of the present invention.

Here, FIG. 1 is a schematic view showing the structure of a probe device of an embodiment of the present invention. In FIG. 1, for easily explaining processes of an evaluation method of probing of the embodiment of the present invention, illustration of a structural element not related to the process of a probe device is omitted.

Referring to FIG. 1, a probe device 1 of the embodiment of the present invention includes a wafer measuring stage (wafer mounting table) 2, a wafer carrying table 3, a wafer alignment camera 4, a probe card 6, a probe needle recognizing camera 7, and others.

A probe mark evaluation wafer 10 (See FIG. 2) is mounted on the wafer measuring stage (wafer mounting table) 2. The wafer carrying table 3 carries the probe mark evaluation wafer 10 to the wafer measuring stage (wafer mounting table) 2.

The wafer alignment camera 4 is provided above the wafer measuring stage (wafer mounting table) 2 so as to position the probe mark evaluation wafer 10 on the wafer measuring stage (wafer mounting table) 2.

The probe card 6 has a probe needle 5. A probe mark (contact mark or needle trace) is formed on the probe mark evaluation wafer 10 by the probe needle 5 of the probe card 6. The probe needle recognizing camera 7 is attached to the wafer measuring stage (wafer mounting table) 2 so as to recognize the probe needle 5 of the probe card 6.

The probe mark evaluation wafer 10 mounted on the wafer measuring stage 2 is, for example, vacuum-chucked so as to be held at a designated position on the wafer measuring stage 2. The wafer measuring stage 2, as well as the wafer carrying table 3, can be moved in right and left directions and upward and downward. The wafer measuring stage 2 can be rotated by a stepping motor not shown in FIG. 1.

In addition, CCD camera, for example, can be used as the wafer alignment camera 4 and the probe needle recognizing camera 7.

A so-called cantilever type probe card having a structure where a cantilever shaped probe needle 5 is mounted on a printed board can be used as the probe card 6, for example.

Next, the probe mark evaluation wafer 10 used in the probe device 1 of the embodiment of the present invention is discussed with reference to FIG. 2 and FIG. 3.

Figure 2:
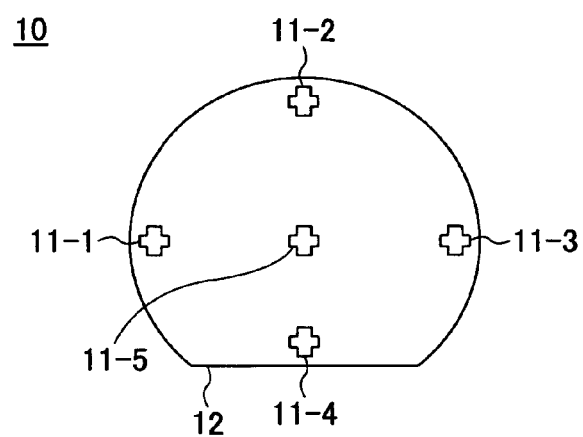
FIG. 2 is a plan view of a probe mark evaluation wafer.

Here, FIG. 2 is a plan view of the probe mark evaluation wafer 10. FIG. 3 is an expanded view of an alignment mark provided on a main surface of the probe mark evaluation wafer 10 shown in FIG. 2.

Referring to FIG. 2, the probe mark evaluation wafer 10 has a size substantially equal to the size of the product wafer. The entire main surface is formed of aluminum. Alignment marks 11-1 through 11-4 are provided at the external periphery of the main surface and an alignment mark 11-5 is provided in the substantially center of the main surface of the probe mark evaluation wafer 10.

Figure 3:
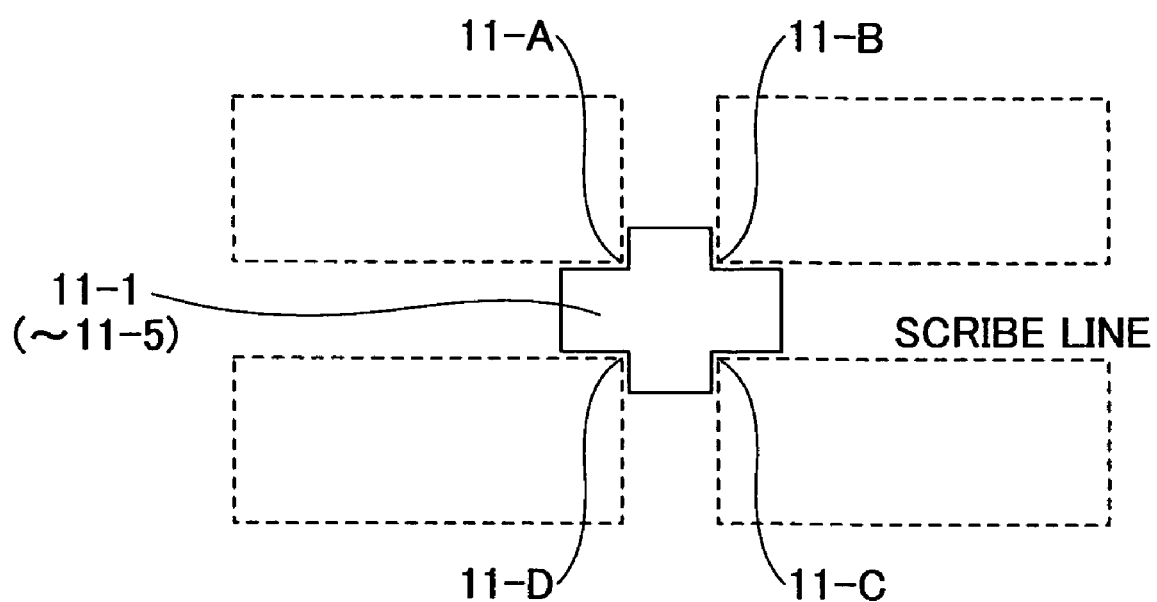
FIG. 3 is an expanded view of an alignment mark provided in a main surface of the probe mark evaluation wafer shown in FIG. 2.

Referring to FIG. 3, the alignment marks 11-1 through 11-5 have cross-shaped configurations. In FIG. 3, a part indicated by dotted lines is where a chip is provided. The alignment marks 11-1 through 11-5 form a part of a scribe line between the chips for dividing the wafer into the chips. As discussed below, it is possible to form and maintain balance of up and down and right and left in the main surface of the probe mark evaluation wafer-10 by using angle parts 11-A through 11-D formed in the external periphery of the alignment marks 11-1 through 11-5.

Next, an example of an evaluation method of a probe mark (contact mark or needle trace) of the probe needle 5, the method using the probe mark evaluation wafer 10 and the probe device 1 having the above-discussed structure is discussed with reference to FIG. 4.

Figure 4:
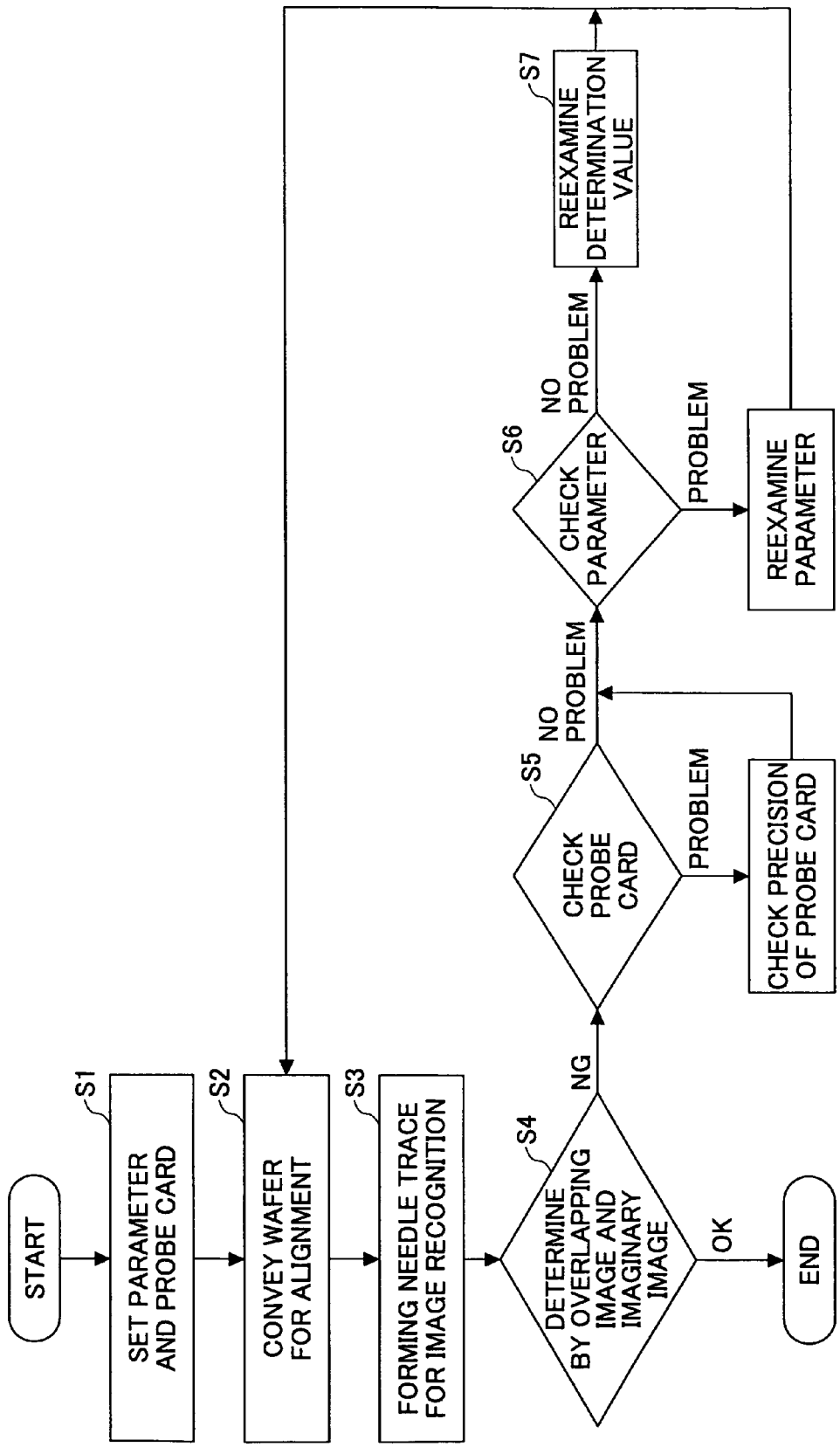
FIG. 4 is a flowchart for explaining an evaluation method of a probe mark of a probe needle of a probe card of the embodiment of the present invention.

Here, FIG. 4 is a first flowchart for explaining the evaluation method of the probe mark (contact mark or needle trace) of the probe needle 5 of the embodiment of the present invention.

Referring to FIG. 4, as step 1, parameters such as the size of the chip provided on the wafer, the size of the electrode pad provided on the chip, the pitch between the electrode pads, position and height of the probe needle 5 of the probe card 6, and a moving length in upper and lower directions of the wafer measuring stage 2 necessary for contact between the probe needle 5 and the probe mark evaluation wafer 10 in a process discussed below, are input in the probe device 1.

Figure 5:
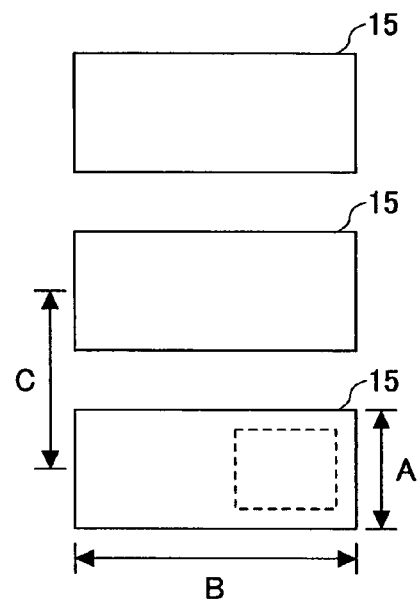
FIG. 5 is a view for explaining setting of the pitch (distance) between the electrode pads and the size of the electrode pad input to the probe device.

Meanwhile, FIG. 5 is a view for explaining setting the pitch between the electrode pads and the size of the electrode pads input to the probe device 1.

Referring to FIG. 5, the size of the electrode pad 15 is determined by a vertical width A and a horizontal length B of the electrode pad 15. The pitch between the electrode pads 15 is determined by a distance C between centers of the neighboring electrode pads 15. For example, the vertical width A of the electrode pad may be approximately 50 μm, the horizontal length B of the electrode pad 15 may be approximately 100 μm, and the pitch C between centers of the neighboring electrode pads 15 may be approximately 60 μm.

Figure 6:
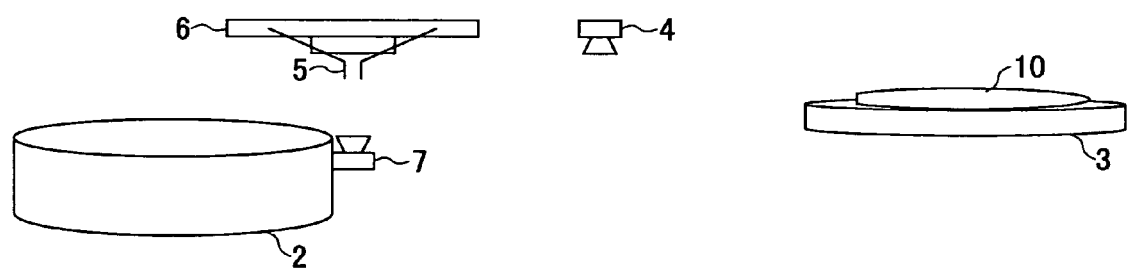
FIG. 6 is a schematic view for showing a process for recognizing the probe needle of the probe card by using a probe needle recognizing camera.

In addition, as shown in FIG. 6, in step 1, the probe mark evaluation wafer 10 is provided on the wafer carrying table 3 and the probe card 6 is fixed inside of the probe device 1. The probe needle recognizing camera 7 is moved below the probe needle 5 of the probe card 6 so that the probe needle 5 is recognized by imaging.

Here, FIG. 6 is a schematic view for showing a process for recognizing the probe needle 5 of the probe card 6 by using the probe needle recognizing camera 7.

It is possible to determine the position and height of the probe needle 5 by using such an image-recognition method. In a case where it is recognized from input position and height information of the probe needle 5 that the position and height of the probe needle 5 vary, for example, from SPECs by an amount equal to or greater than 20 μm, an alarm sounds so that the operator can recognizes a problem of the probe device 1.

Furthermore, in step 1, a determination criterion (determination value) of whether the probe mark (contact mark or needle trace) of the probe needle 5 formed by the process below can be properly positioned in the electrode pad 15 whose size parameter is input, is also input.

For example, the determination criteria may be whether the probe mark (contact mark or needle trace) of the probe needle 5 is positioned in a determination frame, the determination frame being an area having a designated area rate (for example, a half) of the electrode pad 15 of the chip; whether the probe mark (contact mark or needle trace) of the probe needle 5 comes in contact with a determination frame, the determination frame being an external periphery part of the electrode pad 15; or whether the probe mark (contact mark or needle trace) of the probe needle 5 is positioned in a determination frame, the determination frame being an area having a designated size (for example, an area indicated by a dotted line in FIG. 5) inside of the electrode pad 15. The above-discussed determination criteria are examples and the determination criteria may be different depending on the arrangement of the electrode pad.

Next, as step 2 shown in FIG. 4, pre-alignment is implemented by using an orientation flat 12 shown in FIG. 2 so that the probe mark evaluation wafer 10 is conveyed to the wafer measuring stage 2 by using the wafer carrying table 3.

Figure 7:
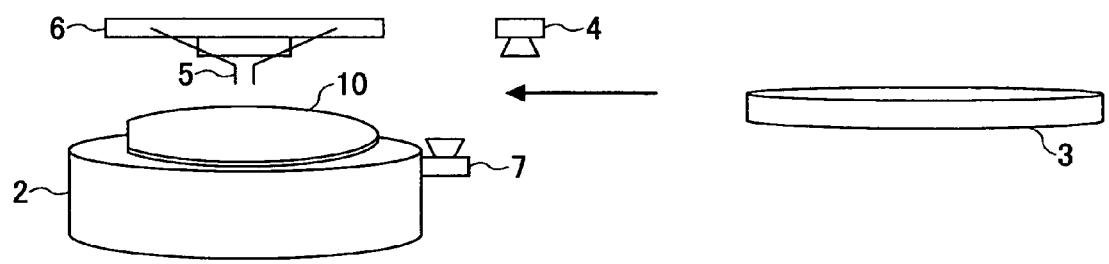
FIG. 7 is a schematic view for showing a process for carrying the probe mark evaluation wafer to a wafer measuring stage by a wafer carrying table.

Here, FIG. 7 is a schematic view for showing a process for carrying the probe mark evaluation wafer 10 to the wafer measuring stage 2 by the wafer carrying table 3.

Figure 8:
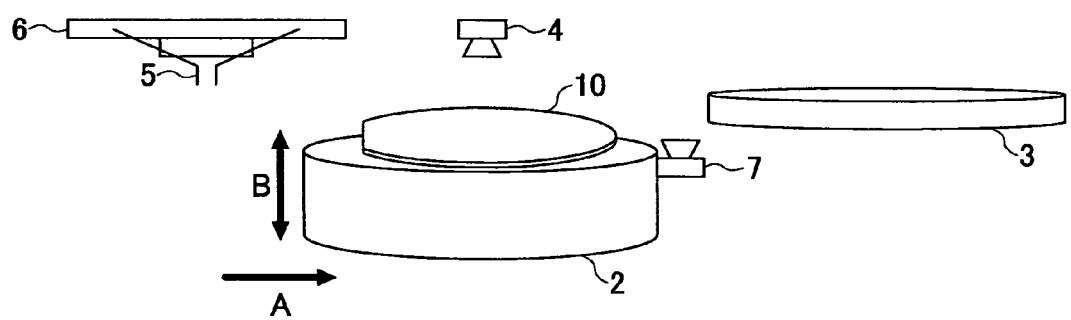
FIG. 8 is a schematic view for showing a process for applying alignment of the probe mark evaluation wafer on the wafer measuring stage.

Next, as shown in FIG. 8, the wafer measuring stage 2 where the probe mark evaluation wafer 10 is mounted is moved in a direction shown by an arrow A, below the wafer alignment camera 4.

Here, FIG. 8 is a schematic view for showing a process for aligning the probe mark evaluation wafer 10 on the wafer measuring stage 2. In addition, the wafer measuring stage 2 can be moved in upper and lower directions shown by an arrow B so as to position the probe mark evaluation wafer 10 on the wafer measuring stage 2.

That is, it is possible to form and maintain balance of up and down and right and left in the main surface of the probe mark evaluation wafer 10 by using angle parts 11-A through 11-D formed in the external periphery of the alignment marks 11-1 through 11-5 with images taken by the wafer alignment camera 4. In this case, considering the height of the probe needle 5 of the probe card 6 recognized in step 1, the probe needle 5 is set so as to not come in contact with the probe mark evaluation wafer 10 too much in the process below.

Next, in step 3 shown in FIG. 4, the probe needle 5 of the probe card 6 and the probe mark evaluation wafer 10 come in contact with each other, so that the probe mark (contact mark or needle trace) of the probe needle 5 is formed on the probe mark evaluation wafer 10.

Figure 9:
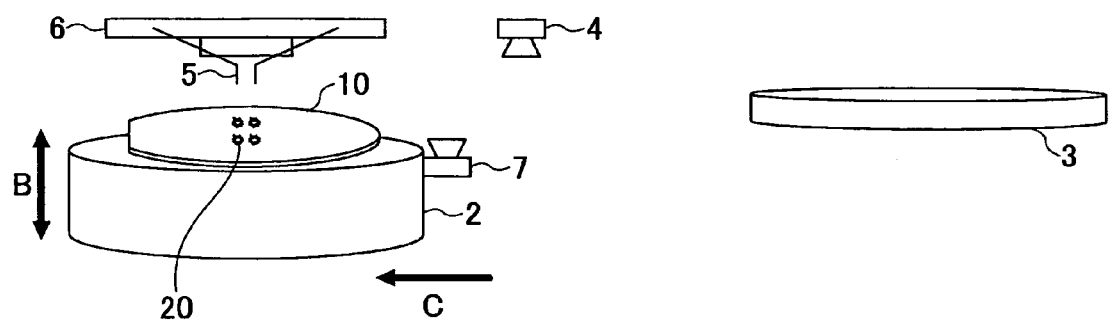
FIG. 9 is a schematic view for showing a process for forming the probe mark of the probe needle of the probe card on the probe mark evaluation wafer.

More specifically, as shown in FIG. 9, the wafer measuring stage 2 is moved in a direction shown by an arrow C below the probe needle 5 of the probe card 6. In addition, the wafer measuring stage 2 is moved up and down in the direction shown by the arrow B, based on the parameters such as the size of the chip provided on the wafer, the size of the electrode pad provided on the chip, the pitch between the electrode pads, the position and height of the probe needle 5 of the probe card 6, and the moving distance in upper and lower directions of the wafer measuring stage 2 necessary for contact between the probe needle 5 and the probe mark evaluation wafer 10. As a result of this, the probe needle 5 of the probe card 6 and the probe mark evaluation wafer 10 come in contact with each other so that the probe mark (contact mark or needle trace) 20 of the probe needle 5 is formed on the probe mark evaluation wafer 10.

Here, FIG. 9 is a schematic view for showing a process for forming the probe mark (contact mark or needle trace) of the probe needle 5 of the probe card 6 on the probe mark evaluation wafer 10.

Figure 10:
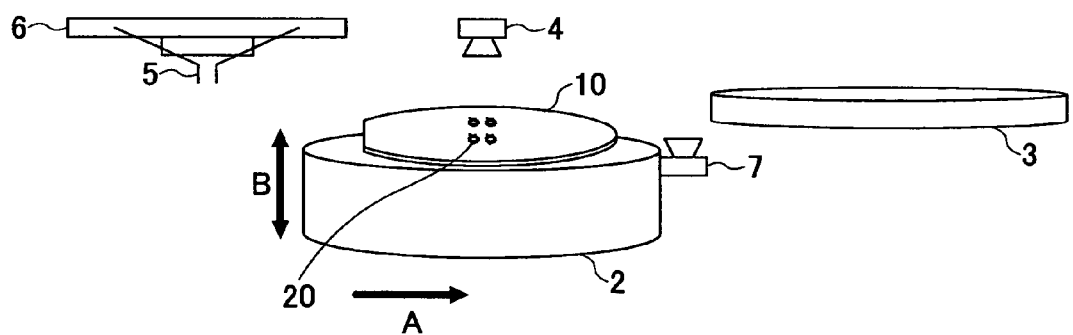
FIG. 10 is a schematic view for showing an image process for recognizing the probe mark of the probe needle formed on the probe mark evaluation wafer by using the wafer alignment camera.

Next, as shown in FIG. 10, the wafer measuring stage 2, where the probe mark evaluation wafer 10 having a surface where the probe mark (contact mark or needle trace) 20 of the probe needle 5 is formed, is mounted, is moved below the wafer alignment camera 4 in a direction shown by the arrow A. The probe mark (contact mark or needle trace) 20 of the probe needle 5 is image-recognized.

Here, FIG. 10 is a schematic view for showing an imaging process for recognizing the probe mark (contact mark or needle trace) of the probe needle 5 formed on the probe mark evaluation wafer 10 by using the wafer alignment camera 4.

Figure 11:
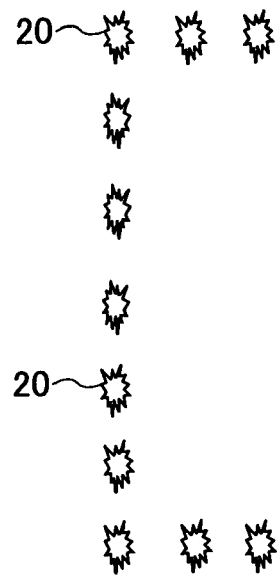
FIG. 11 is a view showing the probe mark of the probe needle being image-recognized by using the wafer alignment camera.

In addition, a probe mark (contact mark or needle trace) 20 of the probe needle 5 that is recognized by imaging with the wafer alignment camera 4 is shown in FIG. 11. The probe mark (contact mark or needle trace) 20 may be displayed on a display part (not shown) of the probe device 1.

Next, in step 4 shown in FIG. 4, an electrode pad is imaginarily displayed on the display part, based on information regarding the size of the electrode pad of the chip provided on the wafer and the pitch between the electrode pads, by using the software installed in the probe device 1. The displayed electrode pad is called, hereinafter, an imaginary electrode pad. An area and a position gap of the probe mark (contact mark or needle trace) 20 are determined by overlapping the imaginary electrode pad and the image of the probe mark (contact mark or needle trace) 20 of the probe needle 5 taken in step 3 (See FIG. 4).

The determination can be made visually via an image formed by overlapping the imaginary pad and the probe mark (contact mark or needle trace) 20, the image being displayed on the display part of the probe device 1. However, in this embodiment, as shown in FIG. 12, the determination is made based on the determination criteria input in step 1.

Figure 12:
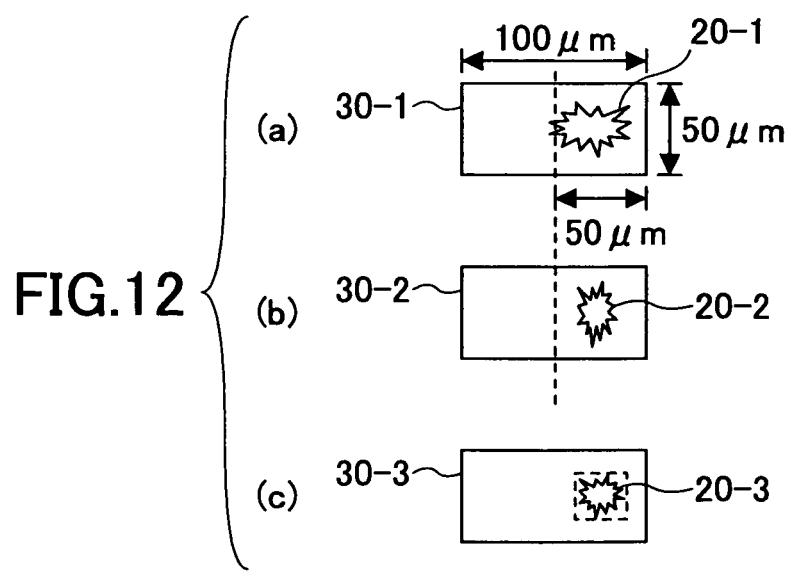
FIG. 12 is a view for explaining a method for determining a position gap or an area of the probe mark by overlapping an imaginary pad with the probe mark.

Here, FIG. 12 is a view for explaining a method for determining a position gap or an area of the probe mark (contact mark or needle trace) 20 by overlapping an imaginary pad with the probe mark (contact mark or needle trace) 20.

For example, as shown in FIG. 12-(a), when the determination criteria is an area having a designated area rate (for example, a half) of the imaginary pad 30-1, the determination may be made based on whether the probe mark (contact mark or needle trace) of the probe needle 5 is positioned in the determination frame. More specifically, for example, the determination may be made based on whether the probe mark (contact mark or needle trace) of the probe needle 5 is positioned in a determination frame, the determination frame having a size half of the imaginary pad, namely a size of length of 50 μm and width of 50 μm in a case of the imaginary pad having a size of length of 100 μm and width 50 μm In addition, as shown in FIG. 12-(b), when the determination area is an external periphery part of the imaginary pad 30-2, the determination may be made based on whether the probe mark (contact mark or needle trace) 20-2 of the probe needle 5 comes in contact with the determination frame.

Furthermore, as shown in FIG. 12-(c), when the determination area is an area having a designated size (for example, an area indicated by a dotted line in FIG. 12-(c)) inside of the imaginary electrode pad 30-3, the determination may be made based on whether the probe mark (contact mark or needle trace) 20-3 of the probe needle 5 is positioned in the determination frame.

If it is determined that the probe mark (contact mark or needle trace) 20 of the probe needle 5 is positioned in the frame as a result of the determination in step 4, the process of the evaluation method of the probe mark (contact mark or needle trace) of the probe needle is finished.

If it is determined that the probe mark (contact mark or needle trace) 20 of the probe needle 5 is not positioned in the frame as a result of the determination in step 4, the process goes to the step 5 (See FIG. 4) so that whether a problem with the probe card 6 is the reason why the probe mark (contact mark or needle trace) 20 of the probe needle 5 is not positioned in the frame is determined.

More specifically, the reason for the probe needle 5 not being positioned in the designated frame is determined.

For example, if the position gap of the probe mark (contact mark or needle trace) 20 is generated, namely if the forming position of the probe mark (contact mark or needle trace) 20 is shifted against the imaginary pad 30, the interval of the probe needles are determined. If the positions of the probe needles 5 are respectively shifted as a whole, it is found that not the probe card 6 but the precision of the probe device 1 is the problem. On the other hand, when one probe mark (contact mark or needle trace) 20 is formed so as to be shifted to an upper side against the imaginary pad 30 and the other probe mark (contact mark or needle trace) 20 is formed so as to be shifted to a lower side against the imaginary pad 30, it is found that the position of the probe needle 5 is the problem.

In addition, if the sizes of the probe mark (contact mark or needle trace) 20 vary, that is, if the size of the probe mark (contact mark or needle trace) 20 is large against one imaginary pad 30 and if the size of the probe mark (contact mark or needle trace) 20 is small against another imaginary pad 30, it is found that the heights of the probe needles 6 vary and therefore the precision of the probe card 6 is the problem.

Thus, when it is determined that the probe card 6 has a problem, the probe card 6 should be reexamined.

If it is found that there is no relationship between the probe card 6 and the reason why the probe mark (contact mark or needle trace) 20 of the probe needle 5 is not positioned in the designated frame, the process goes to the next step, namely step 6 shown in FIG. 4. In other words, the parameters input to the probe device 1 in step 1, that is, the size of the chip provided on the wafer, the size of the electrode pad provided on the chip, the pitch between the electrode pads, position and height of the probe needle 5 of the probe card 6, and the moving distance in upper and lower directions of the wafer measuring stage 2 necessary for contact between the probe needle 5 and the probe mark evaluation wafer 10, are confirmed.

In addition, whether the probe mark evaluation wafer 10 is correctly positioned on the wafer measuring stage 2, whether a rotational angle of a spindle motor rotating for the probe mark evaluation wafer 10 conveyed to the wafer measuring stage 2, or the like is confirmed.

If the parameter input to the probe device 1 in step 1 has a problem, the parameter is reexamined.

If it is found that there is no problem in the probe card 6 and the parameter input to the probe device 1 in step 1, the determination criterion (determination value) of whether the probe mark (contact mark or needle trace) of the probe needle 5 is properly formed is reexamined and changed (See step 7 shown in FIG. 4) so that the process goes back to step 2 (See FIG. 4).

Thus, according to the above-discussed embodiment of the present invention, even if the sizes of the electrode pads formed on the wafer vary and the intervals between neighboring electrode pads vary, without forming the product wafer every time for corresponding to the size and the arrangement of the electrode pads, a single probe mark evaluation wafer is used so that the contact is actually made by using the probe needle of the probe card. Whether the probe mark (contact mark or needle trace) of the probe needle is positioned within the designated standard can be determined by overlapping the probe mark (contact mark or needle trace) and the imaginary image of the electrode pad. Therefore, it is not necessary to manufacture the product wafer and it is easy to evaluate the probe mark (contact mark or needle trace) of the probe needle of the probe card at low cost and high precision.

The present invention is not limited to these embodiments, but variations and modifications may be made without departing from the scope of the present invention.

This patent application is based on Japanese Priority Patent Application No. 2006-14228 filed on Jan. 23, 2006, the entire contents of which are hereby incorporated by reference.

What is claimed is:

1. An evaluation method of a probe mark of a probe needle of a probe card, comprising:
    forming the probe mark of the probe needles on a probe mark evaluation wafer, the probe mark evaluation wafer having an entire main surface formed of aluminum where an actual electrode pad is not formed;
    recognizing the probe mark with imaging;
    overlapping an imaginary electrode pad with the probe mark recognized by imaging so that the probe mark is evaluated,
    wherein the probe mark is evaluated based on a determination criterion that is whether the probe mark is formed in a designated determination frame, the designated determination frame having a designated size and provided on the imaginary electrode pad.

2. The evaluation method of the probe mark of the probe needle of the probe card as claimed in claim 1,
    wherein the imaginary electrode pad is formed based on information regarding a size of an electrode pad of a chip provided on a wafer which chip is a subject of inspection and a pitch of the electrode pads.

3. The evaluation method of the probe mark of the probe needle of the probe card as claimed in claim 1, wherein the determination frame is an area having a designated area ratio against the imaginary electrode pad, the designated area ratio being equal to or less than 1.

4. The evaluation method of the probe mark of the probe needle of the probe card as claimed in claim 1,
wherein the determination frame is formed by an external periphery of the imaginary electrode pad.

5. The evaluation method of the probe mark of the probe needle of the probe card as claimed in claim 1,
wherein if the probe mark is not formed in the determination frame provided in the imaginary electrode pad, whether the probe needle has a problem is determined.

6. The evaluation method of the probe mark of the probe needle of the probe card as claimed in claim 5,
wherein whether the probe needle has a problem is determined based on an area of the probe mark and existence of a position gap of the probe mark in the imaginary electrode pad.

7. The evaluation method of the probe mark of the probe needle of the probe card as claimed in claim 5,
wherein when it is determined that the probe needle does not have a problem, a property of the information regarding the size of the electrode of the chip provided on the wafer which chip is the subject of inspection and the pitch of the electrode pads is determined.

8. The evaluation method of the probe mark of the probe needle of the probe card as claimed in claim 1,
wherein the imaginary electrode pad is formed by operating software.

9. The evaluation method of the probe mark of the probe needle of the probe card as claimed in claim 1,
wherein a result of overlap of the imaginary electrode pad and the image-recognized probe mark is displayed.

10. The evaluation method of the probe mark of the probe needle of the probe card as claimed in claim 1,
wherein the probe mark evaluation wafer is mounted on a wafer mounting part for making alignment before the probe mark is formed on the probe mark evaluation wafer.

11. The evaluation method of the probe mark of the probe needle of the probe card as claimed in claim 10,
wherein five alignment marks are provided on the probe mark evaluation wafer for making the alignment.

\* \* \* \* \*